US006960953B2

(12) United States Patent
Ichihara

(10) Patent No.: US 6,960,953 B2
(45) Date of Patent: Nov. 1, 2005

(54) SEMICONDUCTOR CIRCUIT DEVICE

(75) Inventor: Takashi Ichihara, Otsu (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 10/836,202

(22) Filed: May 3, 2004

(65) Prior Publication Data

US 2004/0217799 A1 Nov. 4, 2004

(30) Foreign Application Priority Data

May 2, 2003 (JP) ....................................... 2003-126813

(51) Int. Cl.[7] ................................................. H03L 5/00
(52) U.S. Cl. ...................................................... 327/333
(58) Field of Search .......................... 327/99, 306, 310, 327/317–319, 328, 333, 407–408; 326/62–63, 68, 75, 80–83

(56) References Cited

U.S. PATENT DOCUMENTS 5,825,205 A 10/1998 Ohtsuka ...................... 326/81
6,600,357 B1 * 7/2003 Kirihara ..................... 327/333
6,724,223 B2 * 4/2004 Ichiguchi et al. ............. 326/81
6,768,368 B2 * 7/2004 Kaneko et al. ............. 327/333
2003/0035325 A1 2/2003 Kim et al. ............. 365/189.09

* cited by examiner

*Primary Examiner*—My-Trang Nuton
(74) *Attorney, Agent, or Firm*—Steptoe & Johnson LLP

(57) ABSTRACT

A semiconductor circuit device, in which an output device is driven by inputting a direct current voltage source having a predetermined potential difference on the high potential side relative to a system ground and a power supply having a potential varied with time relative to the system ground. The semiconductor circuit device includes a voltage conversion circuit which converts an input signal having an amplitude between the system ground and the direct current voltage source into a converted signal having an amplitude between an internal ground and an internal power supply, and outputs the converted signal. The internal ground is controlled to have a potential varied with time relative to the system ground, and the internal power supply is controlled to change according to a change of the internal ground and have the predetermined potential difference on the high potential side when the internal ground has a fixed potential. A selector circuit selects and outputs the input signal and the converted signal according to the potential of the internal ground.

11 Claims, 5 Drawing Sheets

SEMICONDUCTOR CIRCUIT DEVICE

FIELD OF THE INVENTION

The present invention relates to a semiconductor circuit device driven by changing a reference potential with time relative to the system ground of an external system connected to the semiconductor circuit device, among semiconductor circuit devices.

BACKGROUND OF THE INVENTION

In recent years, liquid crystal display devices are used in a wider field of PDAs, OA, and TV sets. Particularly for small portable devices, liquid crystal display devices are widely used far ahead of other kinds of display devices.

In this field, portability is particularly important and thus miniaturization and low power consumption are demanded. Further, a larger screen panel is demanded for visibility. As a matrix liquid crystal panel has a larger screen, a scanning electrode driving device for driving a liquid crystal display panel increases in voltage, resulting in higher power consumption.

One solution for reducing power consumption is to reduce the withstand voltage of the scanning electrode driving device. A driving method and a driving circuit are available which use a power supply oscillating method described in Japanese Unexamined Patent Publication No. 2001-282208.

Referring to FIGS. 5 and 6, the following will describe the driving circuit using a power supply oscillating method shown in FIG. 12 of Japanese Unexamined Patent Publication No. 2001-282208.

FIG. 5 shows a voltage conversion circuit of the conventional art that is constituted of PMOS transistors 515 and 516 and NMOS transistors 517, 518, 519, and 520.

The PMOS transistor 515 has the gate connected to signal input unit 530 and the source and back gate connected to a potential VDD, which is at the "H" level of a direct-current power supply having a low voltage. VDD is the "H" level potential of an input signal of the external system.

The PMOS transistor 516 has the gate connected to an "L" level potential VSS of the direct-current power supply having a low voltage, the source connected to the signal input unit 530, and the back gate connected to the potential VDD. VSS is the ground potential of the external system.

In the above description, "H" level indicates a high level, that is the high potential side of a signal. "L" level indicates a low level, that is the low potential side of a signal. These definitions are applied also in the following description.

The NMOS transistor 517 has the gate connected to the potential VDD, the drain connected to the drain of the PMOS transistor 516, and the back gate connected to a potential VL of an internal circuit. The potential VL is the ground potential applied in the circuit.

The NMOS transistor 518 has the gate connected to the potential VDD, the drain connected to the drain of the PMOS transistor 515, and the back gate connected to the ground potential VL.

The NMOS transistor 519 has the gate connected to the drain of the PMOS transistor 516, the drain connected to the source of the NMOS transistor 518, and the source and back gate connected to the potential VL.

The NMOS transistor 520 has the gate connected to the drain of the PMOS transistor 515, the drain connected to the source of the NMOS transistor 517, and the source and back gate connected to the ground potential VL.

The operations of the circuit shown in FIG. 5 will be described below.

The following will describe the case where a signal having an amplitude between the potential VDD at the "H" level of the external system and the potential VSS at the "L" level of the external system (VDD−VSS) is inputted as a signal of the signal input unit 530 that is an input signal from the external system.

First, when the input of the signal input unit 530 has the potential VDD, the PMOS transistor 515 is turned off and the PMOS transistor 516 is turned on. Thus, the potential VDD is applied to the gate of the NMOS transistor 519 and the NMOS transistor 519 is turned on.

On the other hand, the potential VDD is applied to the gate of the NMOS transistor 517 and the NMOS transistor 517 is turned on with a certain resistance. The NMOS transistor 517 has the function of suppressing through current when the PMOS transistor 516 and the NMOS transistor 520 are turned on/off.

Moreover, the gate of the NMOS transistor 520 has a low potential substantially equal to the ground potential VL, so that the NMOS transistor 520 is turned off. As a result, a signal 540 has a low potential.

The following will describe operations performed when the input unit 530 has the input potential VSS.

When VSS (low potential) is inputted to the input unit 530, the PMOS transistor 515 is turned on and the PMOS transistor 516 is turned off. Then, VDD is applied to the gate of the NMOS transistor 520 and the NMOS transistor 520 is turned on. On the other hand, VDD is applied to the gate of the NMOS transistor 518 and the NMOS transistor 518 is turned on with a certain resistance. The NMOS transistor 518 has the function of suppressing through current when the PMOS transistor 515 and the NMOS transistor 519 are turned on/off. Further, the gate of the NMOS transistor 519 has a low potential substantially equal to the ground potential VL, so that the NMOS transistor 519 is turned off. As a result, the signal 540 has a high potential. Hence, conversion can be performed from a signal having an amplitude between VDD and VSS (VDD−VSS) to a signal having an amplitude between VDD and VL (VDD−VL) With the on resistance of the NMOS transistor 517 and the NMOS transistor 518, it is possible to suppress through current when the PMOS transistor 515 and the NMOS transistor 519 are turned on/off or the PMOS transistor 516 and the NMOS transistor 520 are turned on/off, thereby reducing current consumption and preventing a break caused by heat generated by the transistor.

FIG. 6 shows an example of the potential level of an input signal relative to a potential of the power supply oscillating method according to the conventional art.

FIG. 6 shows the "H" level potential VDD of the input signal of the external system, the "L" level potential of the input signal of the external system, that is the ground potential VSS of the external system, and the ground potential VL applied in the circuit. In addition, reference character VH denotes a high oscillating power supply having a high withstand voltage in the circuit and reference character VCC denotes a supply potential having a low withstand voltage in the circuit.

As is evident from FIGS. 1 and 4 of Japanese Unexamined Patent Publication No. 2001-282208 (not shown), the following fact is well known to persons skilled in the art: the signal 540 of FIG. 5 is subjected to voltage conversion from a signal having an amplitude between VDD and VL (VDD−VL) to a signal having an amplitude between VCC and VL (VCC−VL) and is used in the internal circuit, and the signal 540 is further subjected to voltage conversion to a signal having an amplitude between VH and VL (VH−VL) and is used when the signal is outputted to the outside.

In FIG. 6, when the potential VH is at "L" level, the relationship of VH>VDD>VSS>VCC>VL is established. On the other hand, when the potential VH is at "H" level, the relationship of VH>VCC>VDD>VSS>VL is established. The relational expressions with inequality signs do not always have to be satisfied but it is preferable to satisfy the expressions. An actual embodiment of FIG. 6 has a potential relationship expressed as below.

a. (when VH ias at "L" level) VH, VDD>VSS>VCC>VL b. (when VH is at "H" level) VH>VCC, VDD>VSS>VL As shown in FIG. 6, when the potential VH is at "H" level, VCC and VL are also set at "H" level. That is, a potential difference between the potential VH and the potential VL when the potential VH is at "H" level is almost equal to a potential difference between the potential VH and the potential VL when the potential VH is at "L" level.

In this way, although the potential VH or the potential VL is changed, a potential difference is constant between the potential VH and the potential VL. A power supply configured thus is referred to as an oscillating power supply.

DISCLOSURE OF THE INVENTION

However, in the voltage conversion circuit of FIG. 5, when a potential difference is large between the potential VDD of the power supply used in the external system and the ground potential VL used in the circuit, transistors with high withstand voltage are required as the NMOS transistors 517, 518, 519, and 520. In order to output voltage to the signals 540 and 545, an input signal is necessary with a potential difference equal to or larger than the threshold level of the transistor having a high withstand voltage. Thus, it is necessary to increase a potential difference to a certain degree between the potential VDD of the power supply used in the external system and the ground potential VSS of the external system.

With this configuration, it is recently difficult to directly input a signal, which is inputted with low voltage from the control circuit of the external system having decreased in voltage, to a semiconductor device and directly drive the signal, so that another voltage conversion circuit is necessary for the signal inputted from the external system.

For example, a potential difference is not more than 5.5 volts between the "H" level and the "L" level of the signal inputted from the external system. Voltage is further reduced for lower power consumption.

However, the above-described transistor with a high withstand voltage has extremely high threshold levels, some of which exceed 5 volts. In such case, it is not possible to establish the system of a liquid crystal driving device using the conventional power supply oscillating method.

Moreover, as the number of signals inputted from the external system increases, the circuit for converting a potential becomes larger and it is hard to miniaturize the system. Further, since another circuit is necessary, such a configuration is not suitable for lower voltage, lower power consumption, and miniaturization.

In the configuration of the ordinary voltage conversion circuit using the present power supply oscillating method, when a potential difference is large between the potential VDD and the potential VL, it is extremely difficult to directly input a control signal, which is inputted with a low voltage from the external system, to a semiconductor device and drive the signal.

An object of the present invention is to provide a semiconductor circuit device whereby an input signal level, which is inputted with a low voltage from an external system, can be directly inputted using the power supply oscillating method without permitting an external circuit to level shift an input signal inputted with a low voltage.

In order to solve the above-described problem, the semiconductor circuit device of the present invention, in which an output device is driven by inputting a direct current voltage source having a predetermined potential difference on the high potential side relative to a system ground and a power supply having a potential varied with time relative to the system ground. The semiconductor circuit device includes a voltage conversion circuit which converts an input signal having an amplitude between the system ground and the direct current voltage source into a converted signal having an amplitude between an internal ground and an internal power supply, and outputs the signal. The internal ground is controlled so as to have a potential varied with time relative to the system ground, and the internal power supply is controlled so as to change according to a change of the internal ground and have the predetermined potential difference on the high potential side when the internal ground has a fixed potential. Also included is a selector circuit which selects and outputs the input signal and the converted signal according to the potential of the internal ground.

With this configuration, even when an input signal has a low potential at the high level and the low level, the signal can be inputted to the semiconductor device driven by the oscillating power supply method, without the necessity for additional level shifting outside the device. Further, the external system can be driven with a low voltage source, achieving low power consumption.

In the semiconductor circuit device of the present invention, the internal ground is preferably controlled so as to alternately have a first potential and a second potential, the first potential being substantially equal to the system ground, the second potential having a potential difference for driving the output device on the lower potential side than the first potential.

Further, it is preferable that the first potential is 0 volt, the second potential is −40 volts, and the predetermined potential difference is less than 5.5 volts.

With this configuration, the semiconductor device can be generally used for a signal electrode driving device and a scanning electrode driving device of a display apparatus for performing alternating current driving.

In the semiconductor circuit device of the present invention, it is preferable that the selector circuit selects the input signal as an output signal when the internal ground is substantially equal to the system ground, and the selector circuit selects the converted signal as an output signal when the internal ground has a potential difference for driving the output device on the lower potential side than the system ground.

In the semiconductor circuit device of the present invention, it is also preferable to further include a logical circuit which is arranged so as to generate a first input signal to be inputted to the selector circuit and a second input signal to be inputted to the voltage conversion circuit and which outputs one of the first input signal and the second input signal so that the outputted signal is fixed at the potential of the system ground or the direct current voltage source according to the input of a control signal.

Further, it is preferable that the control signal is controlled so that the second input signal is fixed at the potential of the system ground or the direct current voltage source when the internal ground is substantially equal to the system ground according to the potential of the internal ground, and the first input signal is fixed at the potential of the system ground or the direct current voltage source when the internal ground has a potential with a potential difference for driving the output device on the lower potential side than the system ground.

With this configuration, it is possible to reduce the switching operations of a signal on the side not being selected by the selector circuit.

In the semiconductor circuit device of the present invention, it is preferable that the voltage conversion circuit comprises a first level shifter for converting an input signal having an amplitude between the system ground and the direct current voltage source into a signal having an amplitude between the internal ground and the direct current voltage source, and a second level shifter for converting the signal having an amplitude between the internal ground and the direct current voltage source into a signal having an amplitude between the internal ground and the internal power supply. The second level shifter has an NMOS transistor for preventing through current, the NMOS transistor being provided between the internal ground and the source of an NMOS transistor constituting the second level shifter and having the gate connected to the system ground.

The selector circuit includes a first NMOS transistor having the gate connected to the inverted signal of the system ground and the source connected to the input signal, and a second NMOS transistor having the gate connected to the system ground and the source connected to the converted signal, and an output signal is drawn from a node connecting the drain of the first NMOS transistor and the drain of the second NMOS transistor.

The inverted signal is provided between a high potential source and the internal ground, and has the input supplied as the output of an inverter serving as the system ground.

The high potential source varied according to a change of the internal ground is controlled so as to have the first potential substantially equal to the system ground when the internal ground has a second potential for driving the output device on the lower potential side than the system ground, and the high potential source is controlled so as to have a third potential for permitting the first NMOS transistor to output the input signal from the source to the drain relative to the system ground when the internal ground has the first potential substantially equal to the system ground.

At this point, the first potential is 0 volt, the second potential is −40 volts, the third potential is +40 volts, and the predetermined voltage difference is less than 5.5 volts.

DESCRIPTION OF THE EMBODIMENT

A semiconductor circuit device of the present invention will be described below in accordance with an embodiment shown in FIGS. 1 to 4.

Figure 1:
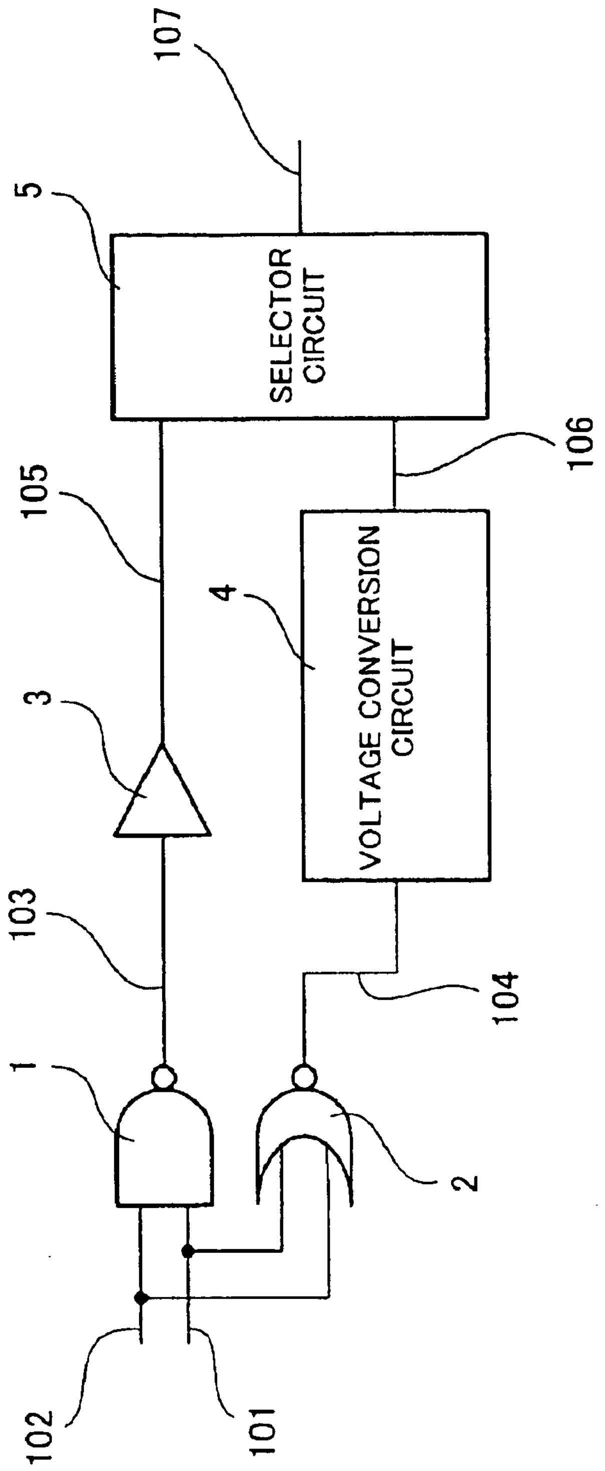
FIG. 1 is a structural diagram showing a semiconductor circuit device according to an embodiment of the present invention.

FIG. 1 is a system diagram showing the semiconductor circuit device of the present invention.

Reference numeral 1 denotes an NAND circuit of low withstand voltage that is operated with the same potential difference as an external system connected to the semiconductor device. Reference numeral 2 denotes a NOR circuit of low withstand voltage that is operated with the same potential difference as the external system. Reference numeral 101 denotes an input signal operated with the same potential as the external system. Reference numeral 102 denotes a control signal which determines a circuit to be operated, according to the oscillation of a potential VL.

Reference numeral 3 denotes a buffer circuit of low withstand voltage that is operated with the same potential difference as the external system. The input signal 101 and the control signal 102 are connected to the inputs of the NAND circuit 1 and the NOR circuit 2, and an output signal 103 of the NAND circuit 1 is connected to the input of the buffer circuit 3.

Reference numeral 4 denotes a voltage conversion circuit which converts a signal operated with the same potential difference as the external system into a signal operated in a circuit of low withstand voltage, with reference to the oscillation of voltage, by using an output signal 104 of the NOR circuit 2 as an input signal.

Reference numeral 5 denotes a selector circuit which switches a signal of the circuit operated with the same potential difference as the external system and a signal of the circuit for converting the signal operated with the same potential difference as the external system into the signal operated in the circuit of low withstand voltage, relative to the oscillation of voltage. To be specific, one of an output signal 105 of the buffer circuit 3 and an output signal 106 of the voltage conversion circuit 4 is selected and a signal 107 is outputted.

Operations performed by the circuit of FIG. 1 will be described below.

First, the following will describe operations performed when the control signal 102 is at “H” level and a potential difference is low between the potential VL, which is the ground potential (internal ground) of the semiconductor circuit device, and a system ground VSS.

When the control signal 102 is at “H” level, the output of the NOR circuit 2 is always fixed at “L” level. At this point, the output of the voltage conversion circuit 4 is fixed at the potential VL and is inputted to the selector circuit 5. The input signal 101 is inverted and outputted to the output of the NAND circuit 1. The input signal 101 is subjected to buffering in the buffer circuit 3 and passes through the selector circuit 5, and then the signal 107 is outputted.

The following will describe operations performed when a potential difference is high between the potential VL and the system ground VSS while the control signal 102 is at “L” level.

When the control signal 102 is at “L” level, the output of the NAND circuit 1 is always fixed at “H” level. The output is subjected to buffering in the buffer circuit 3 and is inputted to the selector circuit 5. The input signal of the input signal 101 is inverted and is outputted to the output of the NOR circuit 2 and is subjected to voltage conversion into a signal having an amplitude between VCC and VL (VCC−VL) in the voltage conversion circuit 4, and then the signal 107 is outputted via the selector circuit 5.

Figure 2:
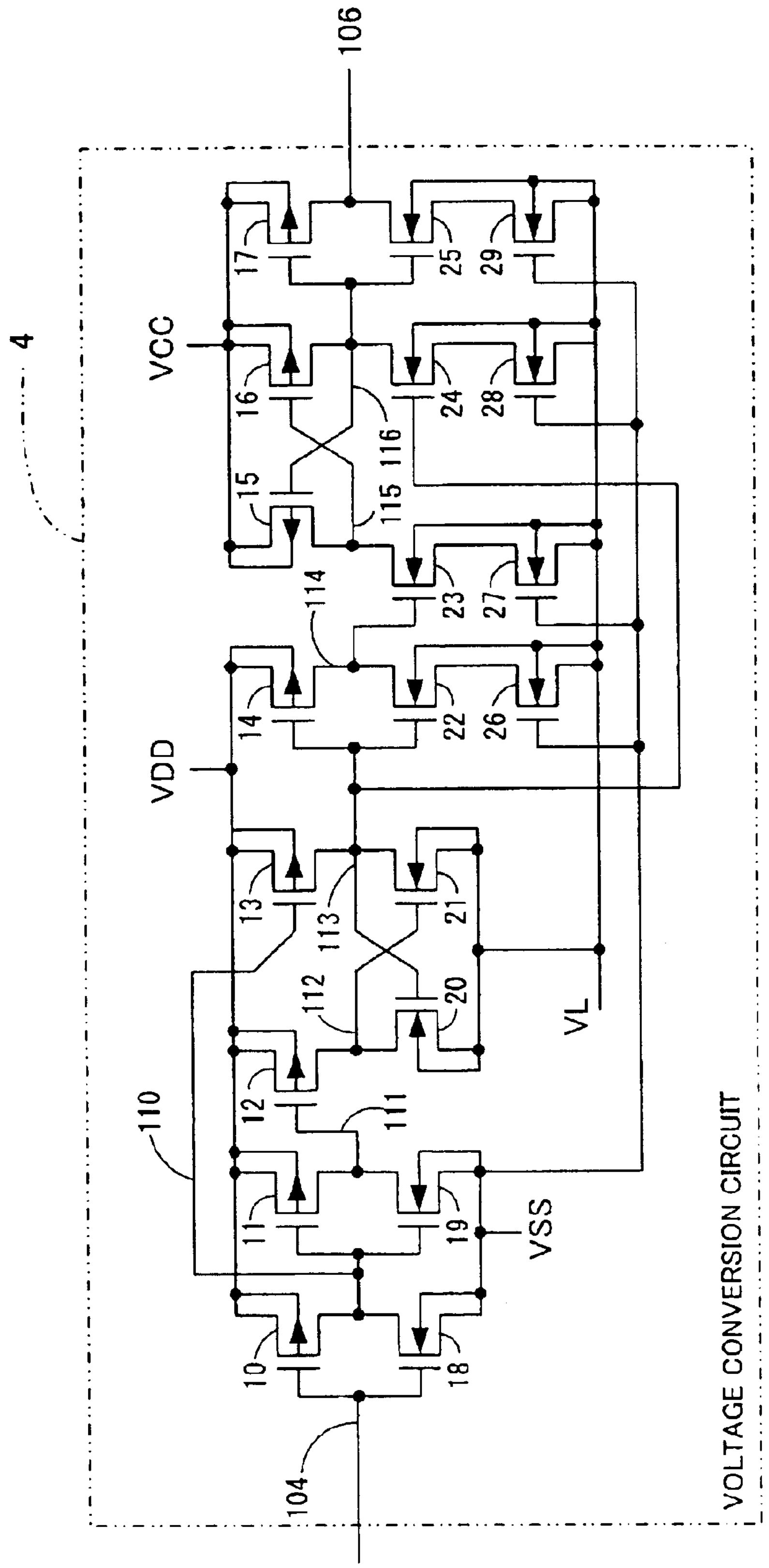
FIG. 2 is a structural diagram showing a voltage conversion circuit according to the embodiment.

The voltage conversion circuit 4 is configured as FIG. 2.

A direct-current power supply having the same potential VDD as an external controller is connected to the sources and the back gates of PMOS transistors 10, 11, 12, 13, and 14. In this case, the transistors 10 and 11 are transistors of low withstand voltage and the transistors 12, 13, and 14 are transistors of high withstand voltage.

The external system ground VSS is connected to the sources and the back gates of NMOS transistors 18 and 19. The external system ground VSS is also connected to the gates of NMOS transistors 26, 27, 28, and 29.

The potential VL serving as the ground of the semiconductor circuit device is connected to the sources and the back gates of NMOS transistors 20, 21, 22, 26, 27, 28, and 29. The potential VL is also connected to the back gates of NMOS transistors 22, 23, 24, and 25. The transistors 18, 19, and 25 are transistors of low withstand voltage and the transistors 20, 21, 22, 23, 24, 27, 28, and 29 are transistors of high withstand voltage.

A supply potential VCC of low withstand voltage in the semiconductor is connected to the sources and the back gates of PMOS transistors 15, 16, and 17. The signal 104 serving as an input signal to the voltage conversion circuit 4 is connected to the gates of the PMOS transistor 10 and the NMOS transistor 18. The transistors 15, 16, and 17 are transistors with low withstand voltage and the transistors 12, 13, and 14 are transistors with high withstand voltage.

The drain of the PMOS transistor 10 and the drain of the NMOS transistor 18 are connected to the gates of the PMOS transistors 11 and 13 and the gate of the NMOS transistor 19.

The drain of the PMOS transistor 11 and the drain of the NMOS transistor 19 are connected to the gate of the PMOS transistor 12.

The drain of the PMOS transistor 12 and the drain of the NMOS transistor 20 are connected to the gate of the NMOS transistor 21.

The drain of the PMOS transistor 13 and the drain of the NMOS transistor 21 are connected to the gate of the NMOS transistor 20 and the gate of the NMOS transistor 24 and are connected to the gate of the PMOS transistor 14 and the gate of the NMOS transistor 22.

The drain of the PMOS transistor 14, the drain of the NMOS transistor 22, and the gate of the NMOS transistor 23 are connected to one another. The drain of the PMOS transistor 15, the drain of the NMOS transistor 23, and the gate of the PMOS transistor 16 are connected to one another.

The drain of the PMOS transistor 16 and the drain of the NMOS transistor 24 are connected to the gate of the PMOS transistor 15, the gate of the PMOS transistor 17, and the gate of the NMOS transistor 25.

The source of the NMOS transistor 22 and the drain of the NMOS transistor 26 are connected to each other. The source of the NMOS transistor 23 and the drain of the NMOS transistor 27 are connected to each other. The source of the NMOS transistor 24 and the drain of the NMOS transistor 28 are connected to each other. The source of the NMOS transistor 25 and the drain of the NMOS transistor 29 are connected to each other.

The drain of the PMOS transistor 17 and the drain of the NMOS transistor 25 are connected to obtain the signal 106, which is the output of the voltage conversion circuit 4. In such connection, the PMOS transistor 10 and the NMOS transistor 18 constitute an inverter, the PMOS transistor 11 and the NMOS transistor 19 constitute an inverter, the PMOS transistor 14 and the NMOS transistors 22 and 26 constitute an inverter, and the PMOS transistor 17 and the NMOS transistors 25 and 29 constitute an inverter.

Further, the PMOS transistors 12 and 13 and the NMOS transistors 20 and 21 constitute a first level shifter for converting a signal having an amplitude between VDD and VSS (VDD−VSS) into a signal having an amplitude between VDD and VL (VDD−VL). The PMOS transistors 15 and 16 and the NMOS transistors 23, 24, 27, and 28 constitute a second level shifter for converting a signal having an amplitude between VDD and VL (VDD−VL) into a signal having an amplitude between VCC and VL (VCC−VL).

The operations of the voltage conversion circuit 4 shown in FIG. 2 will be discussed below.

The following description is based on the premise that the input signal from the external system is composed of a pulse signal having the potential VDD and the external system ground VSS and the pulse signal is applied as the signal 104 to the input of the voltage conversion circuit 4.

First, the following will describe operations performed when the potential VL serving as the ground of the semiconductor circuit device is a low potential relative to the external system ground VSS (VL<VSS).

In VL>VSS, the NMOS transistors 26, 27, 28, and 29 are turned on to output the potential VL to each drain. In VL <VSS, the NMOS transistors 26, 27, 28, and 29 are turned off to interrupt through current.

When the signal 104 serving as the input signal to the voltage conversion circuit 4 has the potential VDD, the PMOS transistor 10 is turned off, the NMOS transistor 18 is turned on, and the potential VSS is outputted to the signal 110, so that the PMOS transistor 13 is turned on.

When the potential VSS is outputted to the signal 110, the PMOS transistor 11 is turned on, the NMOS transistor 19 is turned off, and the potential VDD is outputted to a signal 111, so that the PMOS transistor 12 is turned off.

When the potential VSS is outputted to the signal 110 to turn on the PMOS transistor 13, the potential VDD is outputted to a signal 113 to turn off the PMOS transistor 14. Further, by outputting the potential VDD to the signal 113, the NMOS transistors 20 and 22 are turned on and the potential VL is outputted to signals 112 and 114. The NMOS transistor 21 is turned off.

Moreover, the potential VDD is outputted to the signal 113 to turn on the NMOS transistor 24. The potential VL is outputted to the signal 114 to turn off the NMOS transistor 23. The potential VCC is outputted to a signal 115 to turn off the PMOS transistor 16. The potential VL is outputted to a signal 116.

By outputting the potential VL to the signal 116, the PMOS transistor 17 is turned on, the NMOS transistor 25 is turned off, and the potential VCC is outputted to the output signal 106 of the voltage conversion circuit 4. In this way, the potential VDD of the signal 104 is converted into the potential VCC and is outputted as the signal 106.

The following will describe operations performed when the signal 104 has the potential VSS.

When the signal 104 serving as an input signal to the voltage conversion circuit 4 has the potential VSS, the PMOS transistor 10 is turned on, the NMOS transistor 18 is turned off, the potential VDD is outputted to the signal 110 to turn off the PMOS transistors 11 and 13 and turn on the NMOS transistor 19, and the potential VSS is outputted to the signal 111 to turn on the PMOS transistor 12.

The potential VL is outputted to the signal 113 to turn on the PMOS transistor 14, the NMOS transistors 20, 22, and 24 are turned off, and the potential VDD is outputted to the signals 112 and 114.

By outputting the potential VDD to the signal 114, the NMOS transistor 23 is turned on, the potential VL is outputted to the signal 115, the PMOS transistor 16 is turned on, the potential VCC is outputted to the signal 116, the PMOS transistor 15 is turned off, the PMOS transistor 17 is turned off, the NMOS transistor 25 is turned on, and the potential VL is outputted as the output signal 106 of the voltage conversion circuit 4. In this way, the potential VSS of the signal 104 is converted into the potential VL and is generated in the output signal 106 of the voltage conversion circuit 4.

The following will describe operations performed when the potential VL serving as the ground of the semiconductor circuit device is almost equal to the ground VSS of the external system (VL≈VSS).

Regardless of the level of the signal 104 serving as an input signal to the voltage conversion circuit 4, the NMOS transistors 26, 27, 28, and 29 are always turned off because a potential difference of the potential VL from the potential VSS is a low potential. Thus, the output signal 106 of the voltage conversion circuit 4 has a high impedance. Even if the output of the voltage conversion circuit 4 has a high impedance, no problem arises because the switch of the selector circuit 5 in the subsequent stage is turned off, as will be described later.

Since the voltage conversion circuit 4 is configured thus, voltage conversion can be performed from the signal with the potential VDD to the signal with the potential VCC and from the signal with the potential VSS to the signal with the potential VL.

Figure 3:
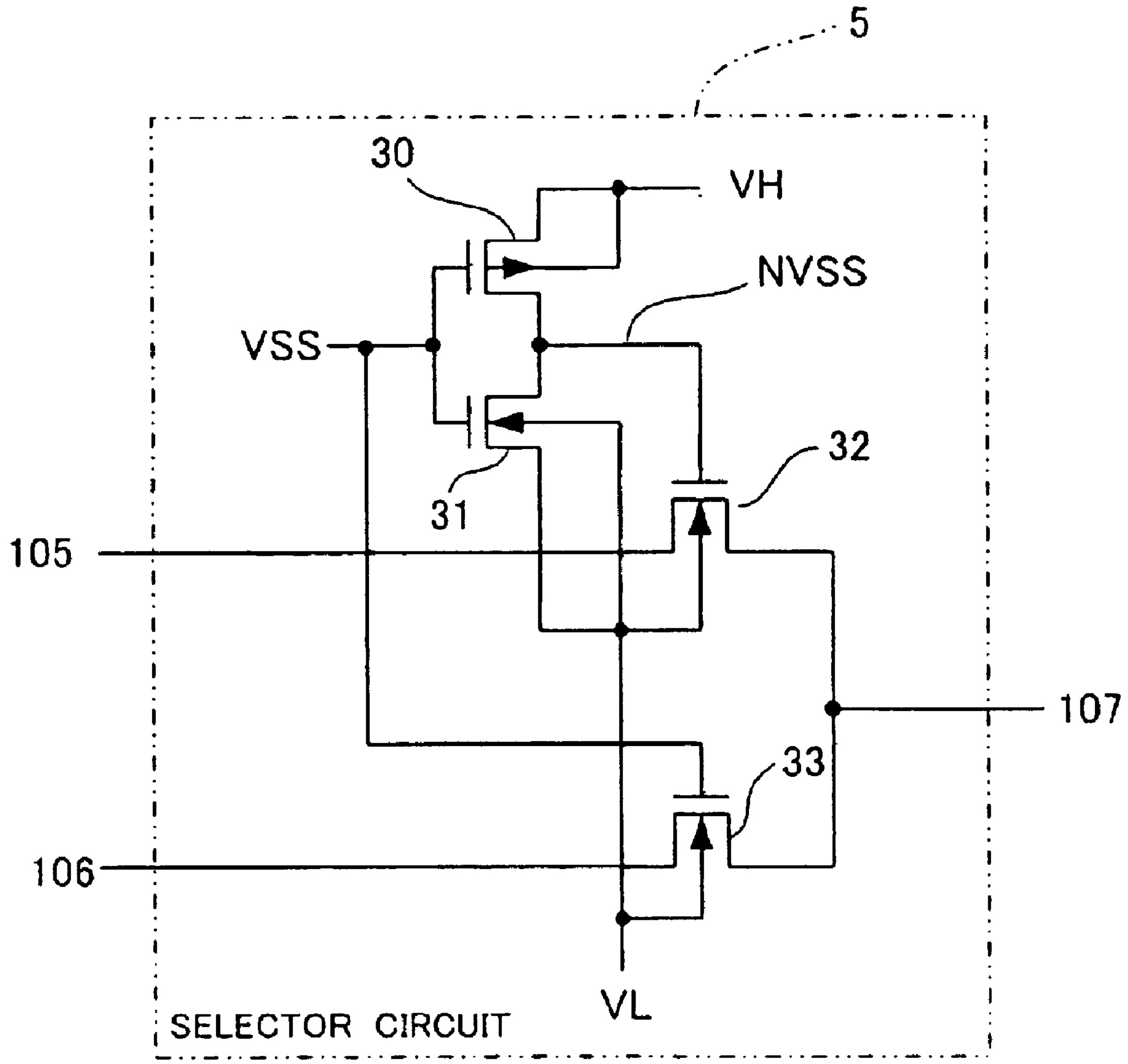
FIG. 3 is a structural diagram showing a selector circuit according to the embodiment.

The selector circuit 5 of FIG. 1 is configured as shown in FIG. 3.

The potential VH, which serves as a power supply having a high withstand voltage in the semiconductor circuit device, is connected to the source and the back gate of a PMOS transistor 30.

The potential VL serving as the ground of the semiconductor circuit device is connected to the source and the back gate of an NMOS transistor 31 and the back gates of NMOS transistors 32 and 33 having high withstand voltage. The transistors 30, 31, 32, and 33 are transistors with high withstand voltage.

The potential VSS of the system ground, which serves as the ground of the external system, is connected to the gate of the NMOS transistor 31, the gate of the PMOS transistor 30 and the gate of the NMOS transistor 31 that constitute an inverter.

From the node of the drain of the PMOS transistor 30 and the drain of the NMOS transistor 31, an inverted signal NVSS of the system ground VSS is connected to the gate of the NMOS transistor 32.

Of the two input signals of the selector circuit 5, the output signal 105 of the buffer circuit 3 is connected to the source of the NMOS transistor 32. The other input signal 106 is connected to the source of the NMOS transistor 33. The output signal 107 of the selector circuit 5 is drawn from a point connecting the drain of the NMOS transistor 32 with high withstand voltage and the drain of the NMOS transistor 33 with high withstand voltage.

The operations of the circuit shown in FIG. 3 will be described below.

First, the following will describe the case where the potential VL serving as the ground of the semiconductor circuit device is equal to the potential VSS serving as the external system ground (VSS=VL).

In the case of (VSS=VL), a high voltage potential difference is obtained between the potential VSS and a potential VH having a high withstand voltage in the semiconductor device. The PMOS transistor 30 is turned on and the NMOS transistors 31 and 33 are turned off, so that the potential VH is outputted to the gate of the NMOS transistor 32 to turn on the NMOS transistor 32.

The NMOS transistor 32 is turned on and the NMOS transistor 33 is turned off, so that the output signal 106 of the voltage conversion circuit 4 is stopped at the NMOS transistor 33 and the output signal 105 of the buffer circuit 3 is outputted as the signal 107.

In this case, the signal 107 is a low-voltage signal which has the "H" level of the signal 105 at the potential VDD and the "L" level of the signal 105 at the potential VSS (in this case VSS=VL).

The following will describe the case where the potential VL serving as the ground of the semiconductor circuit device has a high potential difference relative to the potential VSS serving as the external system ground (VSS>>VL).

In this case, a potential difference has a low voltage between the potential VSS serving as the external system ground and the power supply VH with high withstand voltage in the semiconductor circuit device. The PMOS transistor 30 is turned off and the NMOS transistors 31 and 33 are turned on, so that the potential VL is outputted to the gate of the NMOS transistor 32 and the NMOS transistor 32 is turned off.

The NMOS transistor 32 is turned off and the NMOS transistor 33 is turned on, so that the output signal 105 of the buffer circuit 3 is stopped at the NMOS transistor and the output signal 106 of the voltage conversion circuit 4 is outputted as the signal 107.

In this case, the signal 107 is a low-voltage signal which has the "H" level of the signal 106 at the potential VCC and the "L" level of the signal 106 at the potential VL.

In this way, by using the selector circuit 5, it is possible to select a signal according to the potential VL serving as the ground of the semiconductor circuit device without the necessity for another control signal, the potential VL being changed according to the external system ground. Further, the switch of the selector circuit 5 is constituted only of the NMOS transistors 32 and 33, thereby achieving miniaturization and low power consumption.

Moreover, the inverter circuit constituted of the PMOS transistor 30 and the NMOS transistor 31 does not have to be provided in the selector circuit 5. The inverter circuit generates a signal outside, controls all the selector circuits with one inverter, and effectively miniaturizes the semiconductor device.

Figure 4:
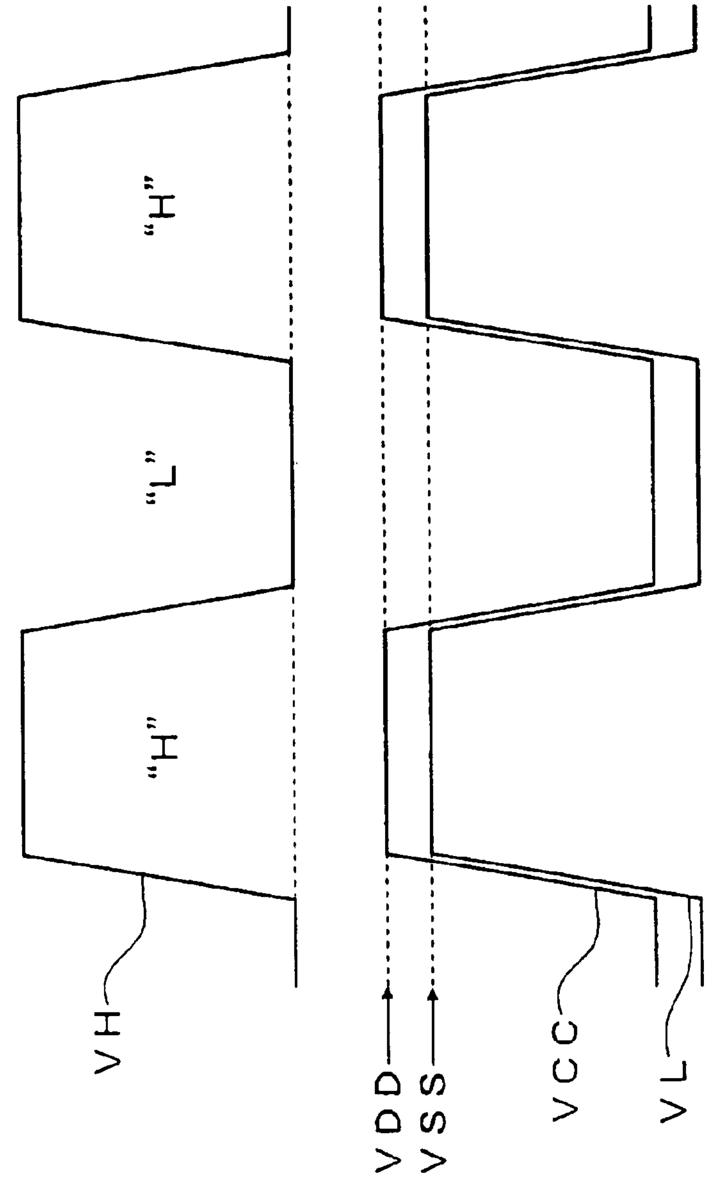
FIG. 4 is a diagram showing a power supply potential according to the embodiment.
Figure 5:
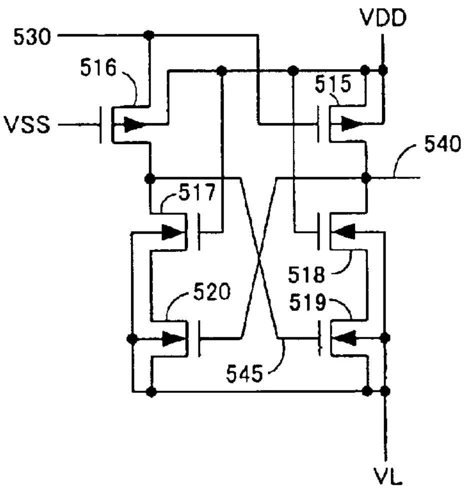
FIG. 5 PRIOR ART
FIG. 5 is a diagram showing a voltage conversion circuit according to an conventional art.
Figure 6:
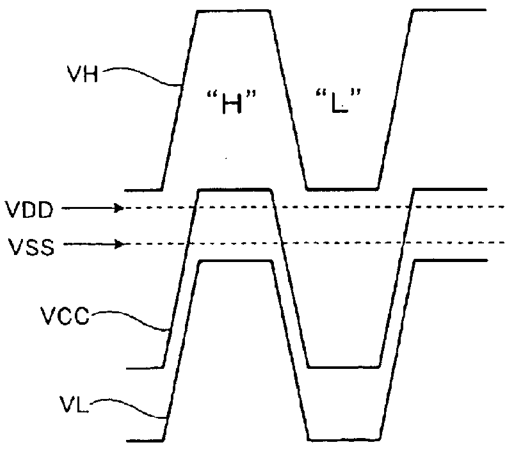
FIG. 6 PRIOR ART
FIG. 6 is a diagram showing a power supply potential according to a conventional power supply oscillating method.

FIG. 4 shows an example of the potential levels of the input signals which are inputted to the circuit devices of FIGS. 1, 2, and 3.

When the potential VH is at "H" level, the relationships of VH>VCC, VDD>VSS, VL are established.

On the other hand, when the potential VH is at "L" level, the relationships of VDD>VH, VSS>VCC>VL are established. The relational expressions with inequality signs do not always have to be satisfied but it is preferable to satisfy the expressions. A specific potential relationship is set as below.

When the potential VH is at "H" level

VH>(VCC=VDD)>(VSS=VL)

When the potential VH is at "L" level,

VDD>(VH=VSS)>VCC>VL

To be specific, when the potential VH is at "H" level, the following potentials are obtained: potential VDD=3.0 volts, potential VSS=0.0 volt, potential VH=+40 volts, potential VL=0.0 volt, and potential VCC=3.0 volts. When the potential VH is at "L" level, the following potentials are obtained: potential VDD=3.0 volts, potential VSS=0.0 volt, potential VH=0.0 volt, potential VL=−40.0 volts, and potential VCC=−37.0 volts.

The present embodiment is not limited to the above numerical values and a voltage inputted as the potential VH does not have be equal to the high oscillating potential VH of the internal circuit. However, generally the circuit size can be reduced by sharing voltage and thus the potential VH is shared in the above embodiment. Actually when the potential VH is at "H" level, it is enough to set the potential VH of a high oscillating power supply at a sufficient potential for turning on the NMOS transistor 32, relative to (VH≈VSS=0.0 volt). When the potential VH is at "L" level, the potential of the high oscillating power supply VH may be almost equal to the system ground VSS with a small potential difference as long as the PMOS transistor 30 is turned off. That is, it is needless to say that the potential of the high oscillating power supply VH is preferably set substantially at the system ground VSS.

In this way, a potential difference between the potential VH and the potential VL with the potential VH at "H" level is equal to a potential difference between the potential VH and the potential VL with the potential VH at "L" level. Further, when the potential VH is at "L" level, a potential difference between the potential VDD and the potential VSS (VDD−VSS) is equal to a potential difference between the potential VCC and the potential VL (VCC−VL). Although the potential VH or the potential VL is changed, a potential difference is constant between the potential VH and the potential VL.

The present embodiment described an example where a potential difference between the potential VDD and the potential VSS and a potential difference between the potential VCC and the potential VL are 3 volts. The same effect can be achieved as long as the system has a potential difference less than 5.5 volts. Also in the case where the potential difference is lower than 3.0 volts, the semiconductor circuit device of the present invention can operate. That is, when the high potential VDD of the external system and the external system ground VSS have a low potential difference of 3 volts or lower, the power supply VCC with low withstand voltage in the internal circuit is preferably inputted with the same potential difference as the high potential VDD of the external system and the external system ground VSS according to the low oscillating power supply VL. Hence, it is possible to perform control so that the signal 107 is outputted all the time with a constant potential difference, relative to the output of the selector circuit 5, according to a potential difference between the internal ground VL, which is a low oscillating power supply, and the system ground, which is the ground of the external system.

The NAND circuit 1 of the present embodiment may be a NOR circuit and the NOR circuit 2 may be an NAND circuit. These circuits can be determined by the polarity (positive logic/negative logic) of an inputted control signal.

Further, the NAND circuit 1 may be an OR circuit and the NOR circuit 2 may be an AND circuit. In this case, an inverter may be inserted in the previous stage or the subsequent stage to have logical consistency.

Moreover, the semiconductor circuit device of the present embodiment can be used for the signal electrode driving device and the scanning electrode driving device of a display apparatus for alternating current driving, in which the electrodes of the signal electrode driving device for driving a plurality of signal electrodes and the electrodes of the scanning electrode driving device for driving a plurality of scanning electrodes are arranged in a matrix form. Particularly in the case of output voltage from the scanning electrode driving device of a passive liquid crystal display panel for alternating current driving, the potential VH (+40 volts in the present embodiment) and the potential VL (−40 volts in the present embodiment) are alternately outputted to the system ground VSS during the alternating current driving. By using the semiconductor circuit device, the used withstand voltage of the scanning electrode driving device can be reduced to the half. Further, driving can be performed by directly inputting a signal, which is inputted with low voltage from a control signal, to the semiconductor. Thus, it is possible to eliminate the necessity for the voltage conversion circuit for the signal inputted from the control signal, achieving a smaller chip size.

According to the semiconductor circuit device of the present invention, even when an input signal has a high level and a low level at low potentials, it is possible to directly input the signal to the semiconductor circuit device driven by an oscillating power supply method, without the necessity for another external level shift circuit. Further, the power supply of the external system can be driven by a low voltage source, thereby achieving low power consumption.

Furthermore, the circuit driven at a low voltage and the circuit used by voltage conversion are usually driven in a separate manner according to each voltage level. Thus, it is possible to reduce the withstand voltage of a used process, reducing a chip area.

What is claimed is:

1. A semiconductor circuit device, in which an output device is driven by inputting a direct current voltage source having a predetermined potential difference on a high potential side relative to a system ground and a power supply having a potential varied with time relative to the system ground, the semiconductor circuit device, comprising:

a voltage conversion circuit which converts an input signal having an amplitude between the system ground and the direct current voltage source into a converted signal having an amplitude between an internal ground and an internal power supply, and outputs the converted signal, the internal ground being controlled so as to have a potential varied with time relative to the system ground, the internal power supply being controlled so as to change according to a change of the internal ground and have the predetermined potential difference on the high potential side when the internal ground has a fixed potential, and a selector circuit which selects and outputs the input signal and the converted signal according to a potential of the internal ground.

2. The semiconductor circuit device according to claim 1, wherein the internal ground is controlled so as to alternately have a first potential and a second potential, the first potential being substantially equal to the system ground, the second potential having a potential difference for driving the output device on a lower potential side than the first potential.

3. The semiconductor circuit device according to claim 2, wherein the first potential is 0 volt, the second potential is −40 volts, and the predetermined potential difference is less than 5.5 volts.

4. The semiconductor circuit device according to claim 1, wherein the selector circuit selects the input signal as an output signal when the internal ground is substantially equal to the system ground, and the selector circuit selects the converted signal as an output signal when the internal ground has a potential difference for driving the output device on a lower potential side than the system ground.

5. The semiconductor circuit device according to claim 1, further comprising a logical circuit arranged to generate a first input signal to be inputted to the selector circuit and a second input signal to be inputted to the voltage conversion circuit, and outputting one of the first input signal and the second input signal so that the outputted signal is fixed at a potential of the system ground or the direct current voltage source according to an input of a control signal.

6. The semiconductor circuit device according to claim 5, wherein the control signal is controlled so that the second input signal is fixed at the potential of the system ground or the direct current voltage source when the internal ground is substantially equal to the system ground in correspondence to the potential of the internal ground, and the first input signal is fixed at the potential of the system ground or the direct current voltage source when the internal ground has a potential with a potential difference for driving the output device on a lower potential side than the system ground.

7. The semiconductor circuit device according to claim 1, wherein the voltage conversion circuit comprises:

a first level shifter for converting an input signal having an amplitude between the system ground and the direct current voltage source into a signal having an amplitude between the internal ground and the direct current voltage source; and a second level shifter for converting the signal having an amplitude between the internal ground and the direct current voltage source into a signal having an amplitude between the internal ground and the internal power supply, the second level shifter including an NMOS transistor for preventing through current, the NMOS transistor being provided between the internal ground and a source of an NMOS transistor constituting the second level shifter and having a gate connected to the system ground.

8. The semiconductor circuit device according to claim 1, wherein the selector circuit comprises:

a first NMOS transistor having a gate connected to an inverted signal of the system ground and a source connected to the input signal; and a second NMOS transistor having a gate connected to the system ground and a source connected to the converted signal, wherein an output signal is drawn from a node connecting a drain of the first NMOS transistor and a drain of the second NMOS transistor.

9. The semiconductor circuit device according to claim 8, wherein the inverted signal is provided between a high potential source and the internal ground, and has an input supplied as an output of an inverter serving as the system ground.

10. The semiconductor circuit device according to claim 9, wherein the high potential source varied according to a change of the internal ground is controlled to have the first potential substantially equal to the system ground when the internal ground has a second potential for driving the output device on a lower potential side than the system ground, and the high potential source is controlled to have a third potential for permitting the first NMOS transistor to output the input signal from the source to the drain relative to the system ground when the internal ground has the first potential substantially equal to the system ground.

11. The semiconductor circuit device according to claim 10, wherein the first potential is 0 volt, the second potential is −40 volts, the third potential is +40 volts, and the predetermined voltage difference is less than 5.5 volts.

* * * * *